(12) United States Patent
Nitta et al.

(10) Patent No.: US 10,481,235 B2
(45) Date of Patent: Nov. 19, 2019

(54) MAGNETIC RESONANCE IMAGING APPARATUS AND IMAGE PROCESSING APPARATUS

(71) Applicant: Toshiba Medical Systems Corporation, Otawara-shi (JP)

(72) Inventors: Shuhei Nitta, Ohta (JP); Kensuke Shinoda, Sakura (JP)

(73) Assignee: Canon Medical Systems Corporation, Otawara-shi (JP)

( * ) Notice: Subject to any disclaimer, the term of this patent is extended or adjusted under 35 U.S.C. 154(b) by 58 days.

(21) Appl. No.: 15/655,281

(22) Filed: Jul. 20, 2017

(65) Prior Publication Data

US 2018/0024217 A1 Jan. 25, 2018

(30) Foreign Application Priority Data

Jul. 21, 2016 (JP) ................................ 2016-143046
Jul. 19, 2017 (JP) ................................ 2017-140196

(51) Int. Cl.
| | | |
|---|---|---|
| G01R 31/02 | (2006.01) | |
| G01R 33/58 | (2006.01) | |
| G06K 9/62 | (2006.01) | |
| G06T 7/00 | (2017.01) | |
| G06T 7/30 | (2017.01) | |

(Continued)

(52) U.S. Cl.
CPC ......... *G01R 33/58* (2013.01); *G01R 33/5608* (2013.01); *G06K 9/00* (2013.01); *G06K 9/6247* (2013.01); *G06K 9/6262* (2013.01); *G06T 7/0002* (2013.01); *G06T 7/0014* (2013.01); *G06T 7/30* (2017.01); *G01R 33/5611* (2013.01); *G01R 33/56563* (2013.01)

(58) Field of Classification Search
USPC .................. 324/307–309, 312, 322
See application file for complete search history.

(56) References Cited

U.S. PATENT DOCUMENTS

| | | |
|---|---|---|
| 5,514,957 A | 5/1996 | Tatebayashi |
| 8,488,860 B2 | 7/2013 | Uchizono et al. |

(Continued)

FOREIGN PATENT DOCUMENTS

| | | |
|---|---|---|
| JP | 62-270143 | 11/1987 |
| JP | 6-189935 | 7/1994 |

(Continued)

*Primary Examiner* — Vincent Q Nguyen
(74) *Attorney, Agent, or Firm* — Oblon, McClelland, Maier & Neustadt, L.L.P.

(57) ABSTRACT

A magnetic resonance imaging apparatus according to an embodiment includes sequence control circuitry and processing circuitry. The sequence control circuitry conducts, on a subject, first imaging and second imaging that is subsequent to the first imaging. The processing circuitry estimates, based on a magnetic resonance image related to the first imaging and an imaging condition set with regard to the second imaging, information about an image quality in a case in which the second imaging is conducted. The processing circuitry presents, on a display, an estimation result, superimposing the estimation result on the magnetic resonance image. The processing circuitry receives a designation operation on the magnetic resonance image from an operator, and changes a setting of the imaging condition related to the second imaging based on the designation operation.

15 Claims, 9 Drawing Sheets

(51) Int. Cl.
*G01R 33/56* (2006.01)
*G06K 9/00* (2006.01)
G01R 33/561 (2006.01)
G01R 33/565 (2006.01)

(56) References Cited

U.S. PATENT DOCUMENTS

| | | | |
|---|---|---|---|
| 2008/0211496 A1* | 9/2008 | Tanoue | G01R 33/3621 |
| | | | 324/307 |
| 2015/0276910 A1* | 10/2015 | Soejima | G01R 33/3621 |
| | | | 324/309 |
| 2016/0146910 A1* | 5/2016 | Kaneko | A61B 5/748 |
| | | | 324/309 |
| 2016/0146914 A1 | 5/2016 | Nitta et al. | |
| 2016/0155229 A1 | 6/2016 | Shinoda et al. | |
| 2016/0349975 A1 | 12/2016 | Sugiura et al. | |

FOREIGN PATENT DOCUMENTS

| | | |
|---|---|---|
| JP | 2009-45274 | 3/2009 |
| JP | 2011-115561 | 6/2011 |
| JP | 5323194 | 10/2013 |
| JP | 2014-393 | 1/2014 |
| JP | 2014-121596 | 7/2014 |
| JP | 2016-97032 | 5/2016 |
| JP | 2016-101439 | 6/2016 |
| JP | 2016-220962 | 12/2016 |
| JP | 2016-220963 | 12/2016 |
| WO | WO 2011/021254 A1 | 2/2011 |

\* cited by examiner

MAGNETIC RESONANCE IMAGING APPARATUS AND IMAGE PROCESSING APPARATUS

CROSS-REFERENCE TO RELATED APPLICATIONS

This application is based upon and claims the benefit of priority from Japanese Patent Application No. 2016-143046, filed on Jul. 21, 2016, and Japanese Patent Application No. 2017-140196, filed on Jul. 19, 2017; the entire contents of which are incorporated herein by reference.

FIELD

Embodiments described herein relate generally to a magnetic resonance imaging apparatus and an image processing apparatus.

BACKGROUND

Magnetic resonance imaging (MRI) is an imaging technique in which nuclear spins of a subject placed in the static magnetic field is magnetically excited with radio frequency (RF) pulses at the Larmor frequency and images are reconstructed from nuclear magnetic resonance (NMR) signals that are generated based on the excitation.

For example, in the case of heart examinations using magnetic resonance imaging, a reference cross-section that is a cross-section based on the anatomical characteristics of the heart is set prior to imaging for diagnosis. Furthermore, during magnetic resonance imaging, various imaging parameters, such as the field of view (FOV), the number of phase encodes, the number of slices, or the reduction factor of parallel imaging, are set prior to the imaging for diagnosis.

As a method for the above settings, for example, there is a method for specifying the setting by presenting the structural information at the cross-section position on a display unit (display) prior to the imaging for diagnosis.

However, in the case of for example less-experienced radiology technologists, it is sometimes the case that the imaging for diagnosis is conducted without consideration on the image quality and consequently, imaging needs to be done again due to insufficient image quality.

DETAILED DESCRIPTION

A magnetic resonance imaging apparatus according to an embodiment includes sequence control circuitry and processing circuitry. The sequence control circuitry conducts, on a subject, first imaging and second imaging that is subsequent to the first imaging. The processing circuitry estimates, based on a magnetic resonance image related to the first imaging and an imaging condition set with regard to the second imaging, information about an image quality in a case in which the second imaging is conducted. The processing circuitry presents, on a display, an estimation result, superimposing the estimation result on the magnetic resonance image. The processing circuitry receives a designation operation on the magnetic resonance image from an operator, and changes a setting of the imaging condition related to the second imaging based on the designation operation.

With reference to the attached drawings, a detailed explanation is given below of a magnetic resonance imaging apparatus and an image processing apparatus according to an embodiment.

EMBODIMENT

Figure 1:
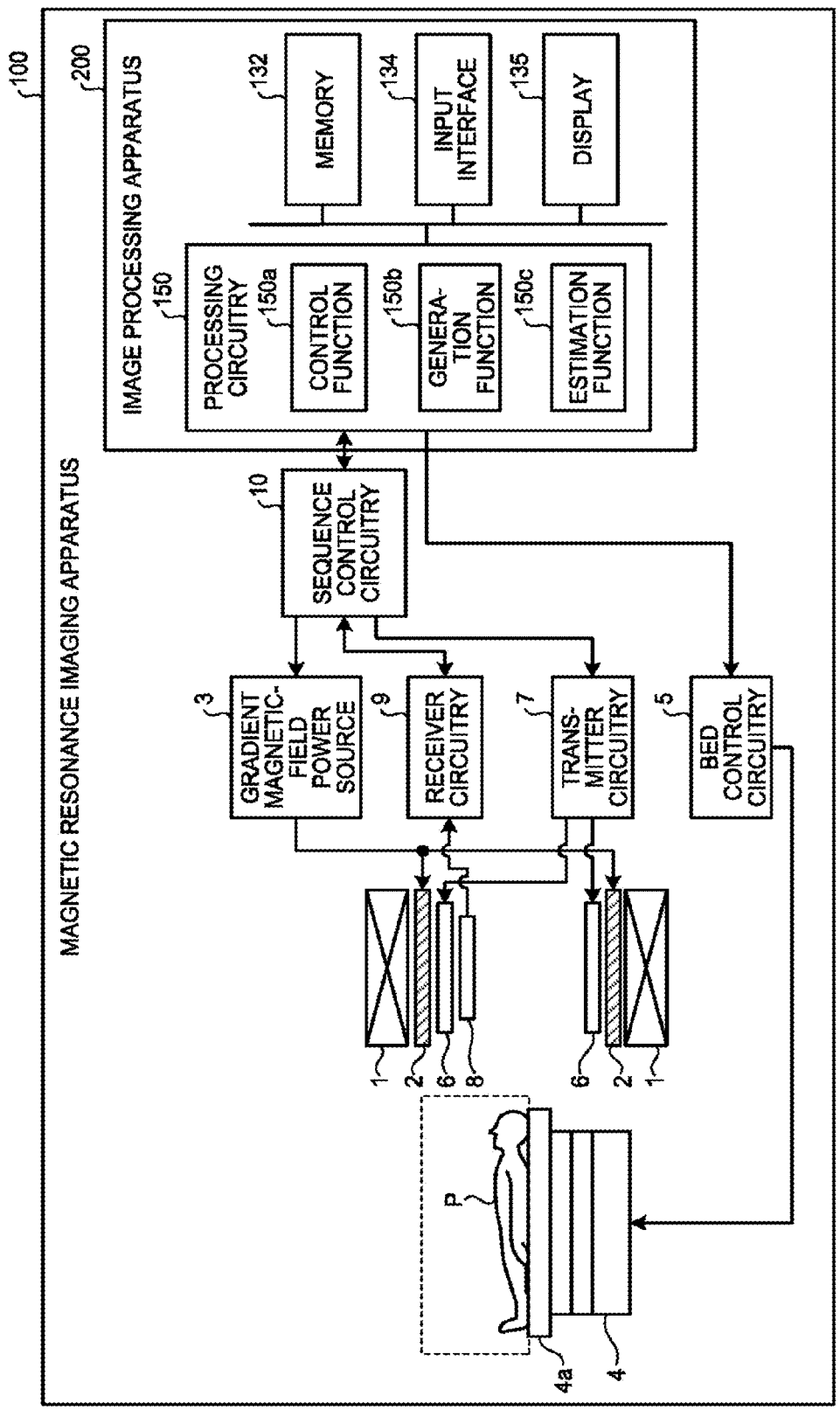
FIG. 1 is a diagram that illustrates a magnetic resonance imaging apparatus according to an embodiment.

FIG. 1 is a diagram that illustrates a magnetic resonance imaging apparatus 100 according to the embodiment. A subject P (within the frame by the dotted line in FIG. 1) is not included in the magnetic resonance imaging apparatus 100.

A static field magnet 1 is formed into a hollow cylindrical shape, and it generates a uniform static magnetic field in its internal space. The static field magnet 1 is, for example, a permanent magnet or a superconductive magnet. A gradient coil 2 is formed into a hollow cylindrical shape, and it generates a gradient magnetic field in its internal space.

Specifically, the gradient coil 2 is located on the inner side of the static field magnet 1, and it receives gradient magnetic field pulses supplied from a gradient magnetic-field power source 3 to generate a gradient magnetic field. The gradient magnetic-field power source 3 feeds gradient magnetic field pulses to the gradient coil 2 based on control signals that are transmitted from a sequence control circuitry 10.

A bed 4 includes a top board 4a on which the subject P is placed, and the top board 4a is inserted into the hollow of the gradient coil 2 that is the imaging opening, in a state where the subject P is placed. Typically, the bed 4 is provided such that its longitudinal direction is parallel to the central axis of the static field magnet 1.

Bed control circuitry 5 drives the bed 4 to move the top board 4a in a longitudinal direction and in a vertical direction.

A transmitter coil 6 generates a magnetic field. Specifically, the transmitter coil 6 is provided on the inner side of the gradient coil 2, and it receives radio frequency (RF) pulses supplied from transmitter circuitry 7 to generate a magnetic field. The transmitter circuitry 7 feeds RF pulses, which correspond to the Larmor frequency, to the transmitter coil 6 based on control signals that are transmitted from the sequence control circuit 10.

A receiver coil 8 receives magnetic resonance signals (hereinafter, MR signals). Specifically, the receiver coil 8 is provided on the inner side of the gradient coil 2, and it receives magnetic resonance signals that are emitted from the subject P due to the effect of the magnetic field. Furthermore, the receiver coil 8 outputs received magnetic resonance signals to receiver circuitry 9.

The receiver circuitry 9 generates magnetic-resonance signal data on the basis of magnetic resonance signals output from the receiver coil 8, based on control signals that are transmitted from the sequence control circuitry 10. Specifically, the receiver circuitry 9 conducts digital conversion on magnetic resonance signals output from the receiver coil 8 to generate magnetic-resonance signal data, and it transmits the generated magnetic-resonance signal data to an image processing apparatus 200 via the sequence control circuitry 10. Furthermore, the receiver circuitry 9 may be provided on the side of a gantry device that includes the static field magnet 1, the gradient coil 2, or the like.

The sequence control circuitry 10(imaging unit) controls the gradient magnetic-field power source 3, the transmitter circuitry 7, and the receiver circuitry 9. Specifically, the sequence control circuitry 10 transmits control signals based on the pulse sequence execution data transmitted from the image processing apparatus 200 to the gradient magnetic-field power source 3, the transmitter circuitry 7, and the receiver circuitry 9. For example, the sequence control circuitry 10 is an integrated circuit, such as an application specific integrated circuit (ASIC) or a field programmable gate array (FPGA), or an electronic circuit, such as a central processing unit (CPU) or a micro processing unit (MPU).

The image processing apparatus 200 includes a processing circuitry 150, a memory 132, an input interface 134, and a display 135. Furthermore, the processing circuitry 150 has a control function 150a, a generation function 150b, and an estimation function 150c in addition to an interface function, a reception function, and a determination function that are not illustrated. The detailed operations of the control function 150a, the generation function 150b, and the estimation function 150c are omitted.

Each processing function, conducted by the control function 150a, the generation function 150b, or the estimation function 150c, is stored in the memory 132 in the form of program executable by a computer. The processing circuitry 150 is a processor that reads a program from the memory 132 and executes it to implement the function that corresponds to each program. In other words, in a state where each program has been read, the processing circuitry 150 has each of the functions that are illustrated in the processing circuitry 150 in FIG. 1. Furthermore, in the explanation of FIG. 1, the single processing circuitry 150 performs processing functions that are conducted by the control function 150a, the generation function 150b, and the estimation function 150c; however, combinations of independent processors may constitute the processing circuitry 150, and each of the processors may execute a program to implement the function.

In other words, there may be a case where each of the above-described functions is configured as a program and the single processing circuitry executes each program, or there may be a case where a specific function is implemented in a dedicated independent program execution circuit. Furthermore, the control function 150a, the generation function 150b, the estimation function 150c, the reception function, and the determination function included in the processing circuitry 150, are examples of a control unit, a generating unit, an estimating unit, a receiving unit (a controller unit), and a determining unit. It is also noted that the display 135 is an example of a display unit.

The term of the "processer" used in the above explanation means for example a central processing unit (CPU), a graphical processing unit (GPU), or a circuit, such as an application specific integrated circuit (ASIC) or a programmable logic device (e.g., a simple programmable logic device (SPLD), a complex programmable logic device (CPLD), or a field programmable gate array (FPGA)). The processor reads and executes a program stored in the memory 132 to implement the function. Furthermore, a configuration may be such that, instead of storing programs in the memory 132, a program is directly installed in a circuit of the processor. In this case, the processor reads and executes a program that is installed in the circuit to implement the function. For example, the memory 132 is a semiconductor memory device, such as a random access memory (RAM) or a flash memory, a hard disk, or an optical disk.

The memory 132 stores image data that is stored by the generation function 150b or other sets of data that are used by the magnetic resonance imaging apparatus 100. For example, the memory 132 is configured by using a semiconductor memory device such as a random access memory (RAM) or a flash memory, a hard disk, an optical disk, or the like.

The input interface 134 receives various types of commands or information inputs from an operator. The input interface 134 is a pointing device, such as a mouse or trackball, or an input device, such as a keyboard.

The display 135 presents various types of information, such as image data, under the control of the processing circuitry 150. The display 135 is, for example, a display device, such as a liquid crystal display device.

The processing circuitry 150 is connected to the sequence control circuitry 10 via an interface function not illustrated, and it controls input/output of data that is transmitted and received between the sequence control circuitry 10 and the image processing apparatus 200.

The processing circuitry 150 uses the control function 150a to perform the overall control on the magnetic resonance imaging apparatus 100, thereby performing a control on image capturing, image generation, image display, or the like. For example, the control function 150a is an integrated circuit such as an ASIC or an FPGA, or an electronic circuit, such as a CPU or an MPU.

Furthermore, as described below, the processing circuitry 150 uses the control function 150a to determine the imaging position of the reference cross-section and efficiently check and correct the information about the image quality at the determined reference cross-section position.

The processing circuitry 150 uses the generation function 150b to reconstruct image data from the magnetic-resonance signal data that is transmitted from the sequence control circuitry 10, and it stores the reconstructed image data in the memory 132. Furthermore, the processing circuitry 150 uses the generation function 150b to acquire, from the memory 132, the three-dimensional data, which includes the imaging minimum of the subject P, and the cross-section position that is being set via the input interface 134, and it generates the corresponding Multi Planar (MPR) image. The generated MPR image is stored in the memory 132.

The processing circuitry 150 uses the estimation function 150c to acquire the three-dimensional data that includes the subject P, the set cross-section position, and the imaging parameter via the input interface 134 from the memory 132 and estimate the information about the image quality of the image for diagnosis. The estimated image quality information is stored in the memory 132.

Next, the background according to the embodiment is briefly explained.

For instance, as a process of examination by magnetic resonance imaging, for example in the case of the heart, after a body-axis transverse cross-section image (Axial), a sagittal cross-section image (Sagittal), and a coronal cross-section image (Coronal), which are called scout images (Scout) or locator images (Locator), are captured, multi-slice images (Axial multi-slice), which are multiple body-axis transverse cross-sections, are captured, and then a reference cross-section is captured. Here, the reference cross-section is a cross-section image based on anatomical characteristics and, in the case of the heart, it is a left ventricular vertical long-axis image (Left ventricular vertical long-axis), a left ventricular horizontal long-axis image (Left ventricular horizontal long-axis), a left ventricular short-axis image (Left ventricular short-axis), a left ventricular 2-chamber long-axis image (Left ventricular 2-chamber long-axis), a left ventricular 3-chamber long-axis image (Left ventricular 3-chamber long-axis), a left ventricular 4-chamber long-axis image (Left ventricular 4-chamber long-axis), or the like. During examination, for example, there is a need to set the cross-section position of the reference cross-section. Furthermore, the reference cross-section and the method of setting the reference cross-section are determined not only for the heart but also for various targets, such as the brain, shoulders, or knees.

Furthermore, for examinations, there is a need to set not only the above-described cross-section position but also various imaging parameters. Here, the imaging parameter is, for example, the FOV, the number of phase encodes, the number of slices, or the reduction factor for parallel imaging, such as the sensitivity encoding (SENSE) technique for high-speed imaging by decimation on sampling.

There is a known method for setting the cross-section position or the like, on the basis of the information related to the form at the cross-section position. However, according to the technologies, the information about the image quality is not included; therefore, for example, in the case of less-experienced radiology technologists, images are acquired without previous consideration on the information about the image quality and, as a result, they are often to be acquired again due to image quality failures; thus, as a result, examination throughput is sometimes decreased.

Because of the above background, the magnetic resonance imaging apparatus 100 according to the embodiment estimates the information about the image quality and presents the estimated information, superimposing the estimated information on the image data or the cross-section image, on the display unit (the display).

Figure 2:
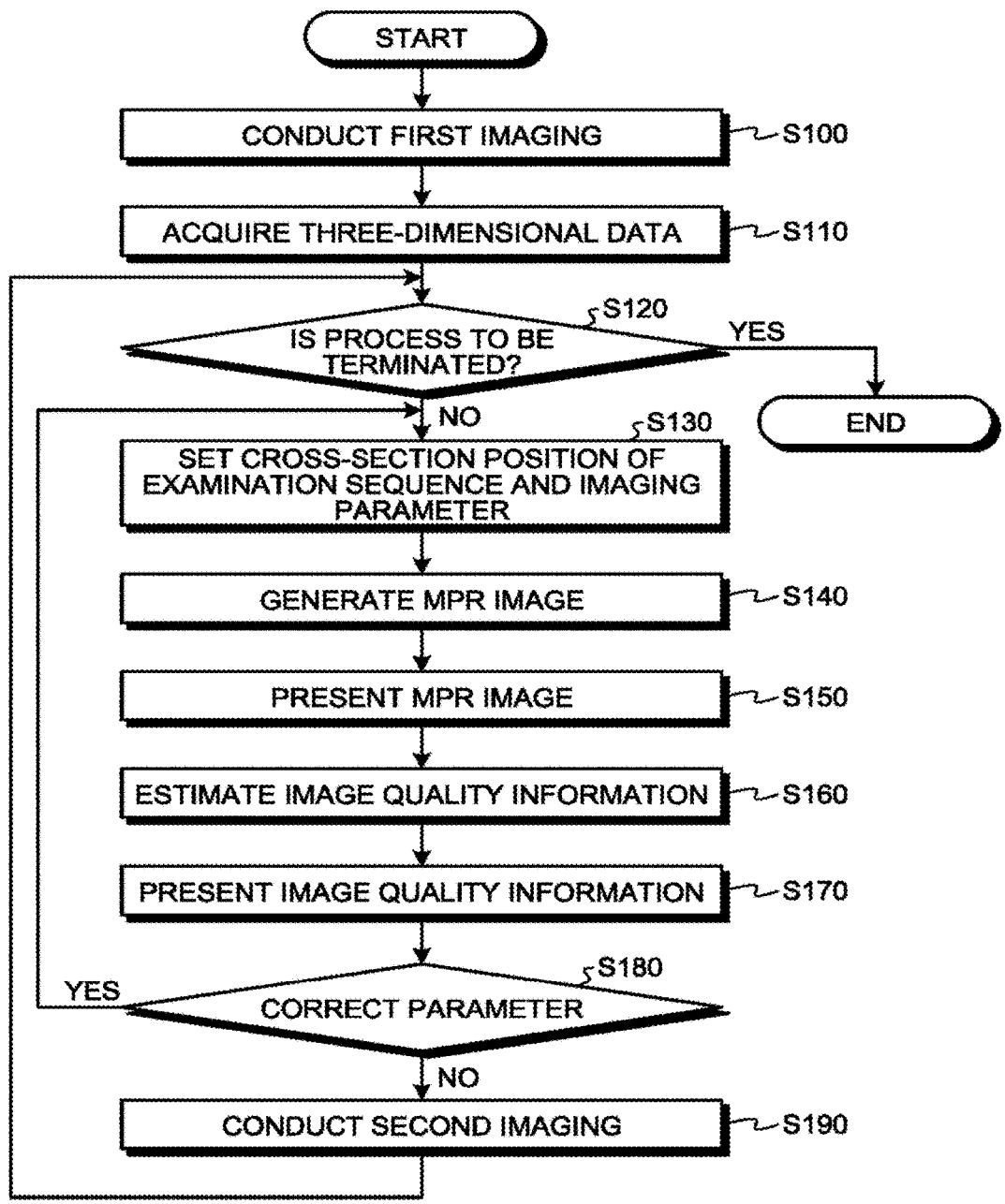
FIG. 2 is a flowchart that illustrates the steps of a process that is performed by the magnetic resonance imaging apparatus according to the embodiment.

FIG. 2 is a flowchart that illustrates the steps of a process that is performed by the magnetic resonance imaging apparatus according to the embodiment. FIGS. 3 to 10 are diagrams that illustrate the process that is performed by the magnetic resonance imaging apparatus according to the embodiment.

The sequence control circuitry 10 conducts first imaging (Step S100). Next, the processing circuitry 150 uses an acquiring unit (not illustrated) to acquire the image data (e.g., the three-dimensional data) on the basis of the first imaging that is conducted by the sequence control circuitry 10 at Step S100 (Step S110).

Here, examples of the image data include locator images that indicate the form information on the subject P that is the target to be imaged. Here, at Step S100, the sequence control circuitry 10 conducts imaging to acquire a locator image as the first imaging. Here, a specific example of the first imaging, which is the imaging to acquire locator images, is the 3D fast field echo (FFE) sequence, which is gradient echo (GE)-based pulse sequence, or the 3D steady-state free precession (SSFP) sequence. Furthermore, prior to the 3D FFE sequence or the 3D SSFP sequence, the sequence control circuitry 10 may add a pulse sequence to apply T2 preparation pulse. As the sequence control circuitry 10 applies the T2 preparation pulse, the processing circuitry 150 may generate images with highlighted anatomy contrast by using the generation function 150b.

Furthermore, for instance, other examples of the image data include images (sensitivity map) that represent the sensitivity distribution of the receiver coil 8. Here, at Step S100, the sequence control circuitry 10 conducts imaging to acquire the sensitivity map as the first imaging. Specifically, the sequence control circuitry 10 conducts imaging by using, for example, a body coil with high space uniformity and the receiver coil 8 (multi-coil) with low space uniformity.

Then, the processing circuitry 150 uses the generation function 150b to generate the image related to the body coil from the imaging that is conducted by using the body coil. Furthermore, the processing circuitry 150 uses the generation function 150b to generate images for each element of the receiver coil 8 from the imaging that is conducted by using the receiver coil 8. At Step S110, the processing circuitry 150 obtains the ratio between the image related to the body coil and the images that are generated for each element of the receiver coil 8, thereby acquiring the image (sensitivity map) that represents the sensitivity distribution of the receiver coil 8.

Furthermore, for example, other examples of the image data include shimming images that represent the magnetic field distribution of a static magnetic field (B0) or a high-frequency magnetic field (B1). Specifically, at Step S100, the sequence control circuitry 10 conducts imaging to obtain a shimming image. Then, the processing circuitry 150 uses the generation function 150b to generate a shimming image on the basis of the imaging that is conducted at Step S100. For example, the processing circuitry 150 uses the generation function 150b to calculate the image that represents the distribution of B0 that is the intensity distribution of the static magnetic field, from the phase difference in multiple magnetic resonance imaging images at different echo times. Furthermore, for example, the processing circuitry 150 uses the generation function 150b to calculate the image that represents the distribution of B1 that is the intensity distribution of the high-frequency magnetic field, from for example the ratio between the intensities of multiple magnetic resonance imaging images to which different excitation pulses are applied.

Next, the sequence control circuitry 10 determines whether the process is to be terminated (Step S120). If there is no remaining examination sequence to be processed and it is determined that the process is to be terminated (Yes at Step S120), the sequence control circuitry 10 terminates the process. Conversely, if there is a remaining examination sequence to be processed, the sequence control circuitry 10 determines that the process is not to be terminated (No at Step S120), and the process proceeds to Step S130.

Then, the processing circuitry 150 sets the cross-section position of the examination sequence and the imaging parameter (Step S130). Specifically, first, the processing circuitry 150 receives inputs of the information that specifies the cross-section position of the examination sequence and the information related to the imaging parameter (information related to the image quality in a case in which a second imaging that is subsequent to the first imaging is conducted) via the input interface 134.

The processing circuitry 150 receives an input of the information that specifies the cross-section position of the examination sequence. Here, as examples of the information that specifies the cross-section position of the examination sequence, the processing circuitry 150 receives inputs of, for example, the position of the single point o on the cross-section and the directions of two unit vectors u and v which constitute a plain face, via the input interface 134. Furthermore, if the components of o, u, and v are written explicitly, they are represented by using, for example, the following Equations (1) and (2).

$$o=(o_x,o_y,o_z) \quad (1)$$

$$u=(u_x,u_y,v_z), v=(v_x,v_y,v_z) \quad (2)$$

Figure 3:
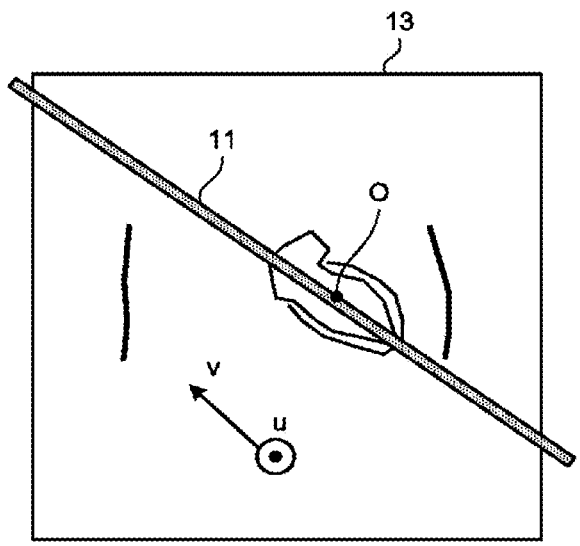
FIG. 3 is a diagram that illustrates the process that is performed by the magnetic resonance imaging apparatus according to the embodiment.

An example of the input screen is illustrated in FIG. 3. An image 13 represents the reconstructed image of the examination sequence that is already imaged. A cross-section 11 represents the cross-section of the examination sequence that is set by the processing circuitry 150 at Step S130. For example, the processing circuitry 150 receives inputs of the position (the point o) at the center of the cross-section 11 and the directions of the two unit vectors u and v that constitute the cross-section 11.

Figure 4:
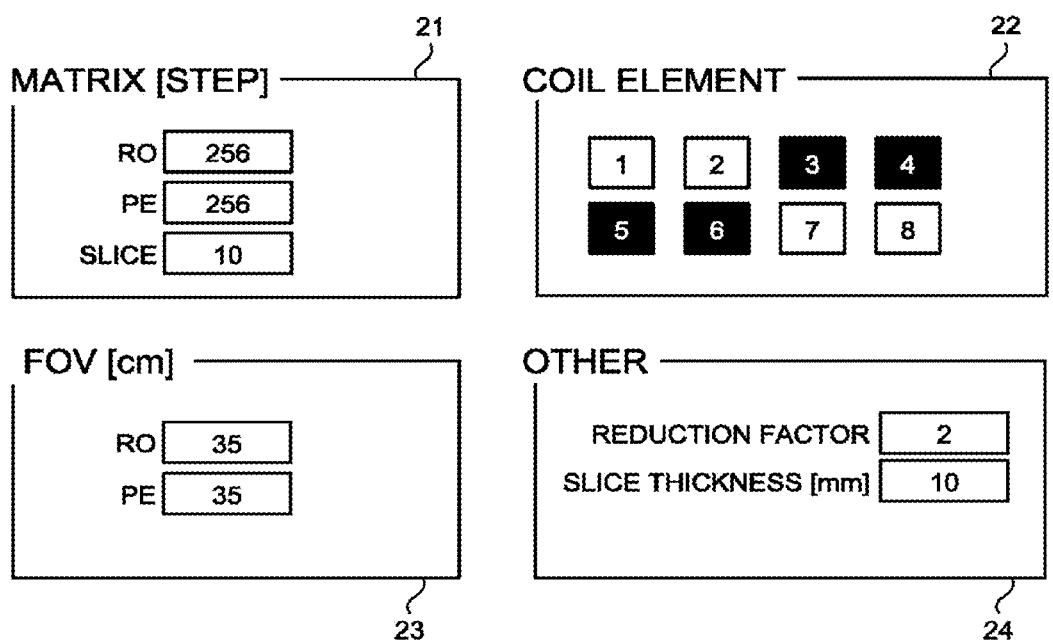
FIG. 4 is a diagram that illustrates the process that is performed by the magnetic resonance imaging apparatus according to the embodiment.

Furthermore, the processing circuitry 150 receives an input of the information about imaging parameters. FIG. 4 illustrates such a situation. An edit box 21 is an edit box for specifying settings about the matrix size. A check box 22 is a check box for specifying the settings with regard to the presence or absence of use of each element of the receiver coil 8. An edit box 23 is an edit box for specifying the settings about the imaging range.

The processing circuitry 150 receives inputs of the information about, for example, the matrix size in the read-out direction (the RO direction), the matrix size in the phase encode direction (the PE direction), and the matrix size in the slice direction via the edit box 21.

For example, the processing circuitry 150 receives the presence or absence of use of each element of the receiver coil 8 via the check box 22.

The processing circuitry 150 receives inputs of the information about for example the imaging range in the read-out direction (the RO direction) and for example the phase encode direction (the PE direction) via the edit box 23.

The processing circuitry 150 receives for example the reduction factor in the PE direction for parallel imaging or the slice thickness via an edit box 24, or the like.

On the basis of the received information, the processing circuitry 150 sets the cross-section position of the examination sequence and the imaging parameter. The processing circuitry 150 stores the set cross-section position of the examination sequence and the imaging parameter in the memory 132.

Furthermore, as the imaging parameters, the processing circuitry 150 may handle parameters, such as the value of the current that flows through the static magnetic-field compensation coil or the waveform, phase, intensity, or the like, of each transmission port for high-frequency magnetic field adjustment.

With reference back to FIG. 2, the processing circuitry 150 generates an MPR image (cross-section image) that includes a predetermined region of interest in predetermined cross-section, from the image data (e.g., the three-dimensional data) that is acquired at Step S110 (Step S140). Then, the processing circuitry 150 uses the control function 150a to present the cross-section image (MPR image) generated at Step S140, on the display 135 (Step S150).

Figure 5:
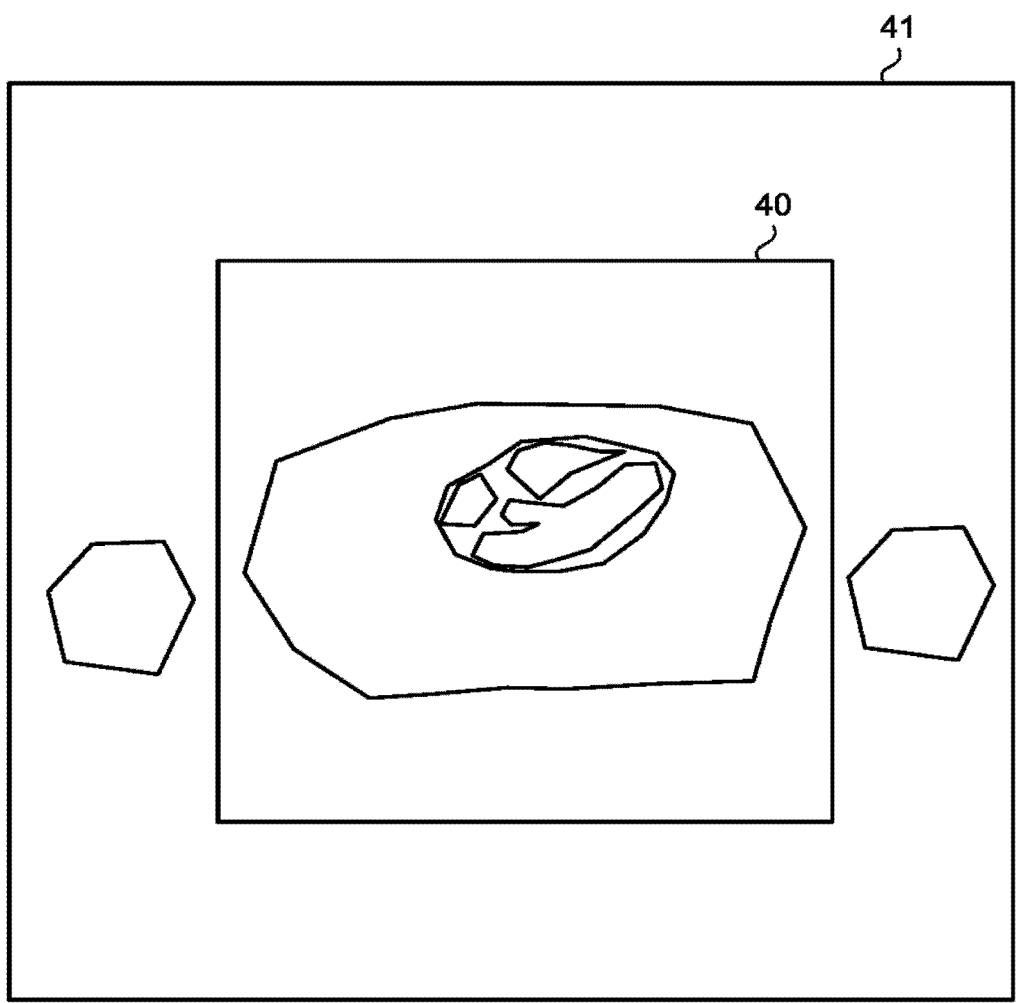
FIG. 5 is a diagram that illustrates the process that is performed by the magnetic resonance imaging apparatus according to the embodiment.

FIG. 5 illustrates an example of the MPR image. A cross-section image region 41 represents the region for which the MPR image corresponding to the set cross-section position is generated. Conversely, an imaging range 40 represents the set imaging range. At Step S140, for example, the processing circuitry 150 generates a cross-section image that is the cross-section image region 41 which is larger than the imaging range 40 that is the set imaging range, and that is in the same cross-section position as the set cross-section position.

In this way, for example, the processing circuitry 150 generates the cross-section image on the cross-section image region 41 that is larger than the imaging range 40 that is the set imaging range; thus, it is easier for users to predict, for example, the size of an artifact that influences the set imaging range from outside the set imaging range.

Then, the processing circuitry 150 uses the estimation function 150c to estimate the information about the image quality in the case of imaging being conducted on the basis of the cross-section image generated at Step S140, and the parameter related to the setting of imaging due to magnetic resonance imaging (Step S160). In other words, the processing circuitry 150 estimates information related to image quality in a case in which the second imaging that is subsequent to the first imaging is conducted, based on imaging condition set with regard to the second imaging, and a magnetic resonance image related to the first imaging. Then, the processing circuitry 150 uses the control function 150a to superimpose the information about the image quality, estimated by the estimation function 150c at Step S160, on the above-described image data or cross-section image and presents it on the display 135 (Step S170). In other words, the processing circuitry 150 presents on the display 135, by the control function 135, the estimation result, superimposing the estimation result on the magnetic resonance image corresponding to the first imaging.

Here, at Step S170, the reason why the estimation result is superimposed on the magnetic resonance imaging is the following: By superimposing information about the image quality on a structural image or a functional image, the relative relationship of the information about the image quality with respect to the position of a tumor, for example, becomes more intuitively understandable.

Figure 6:
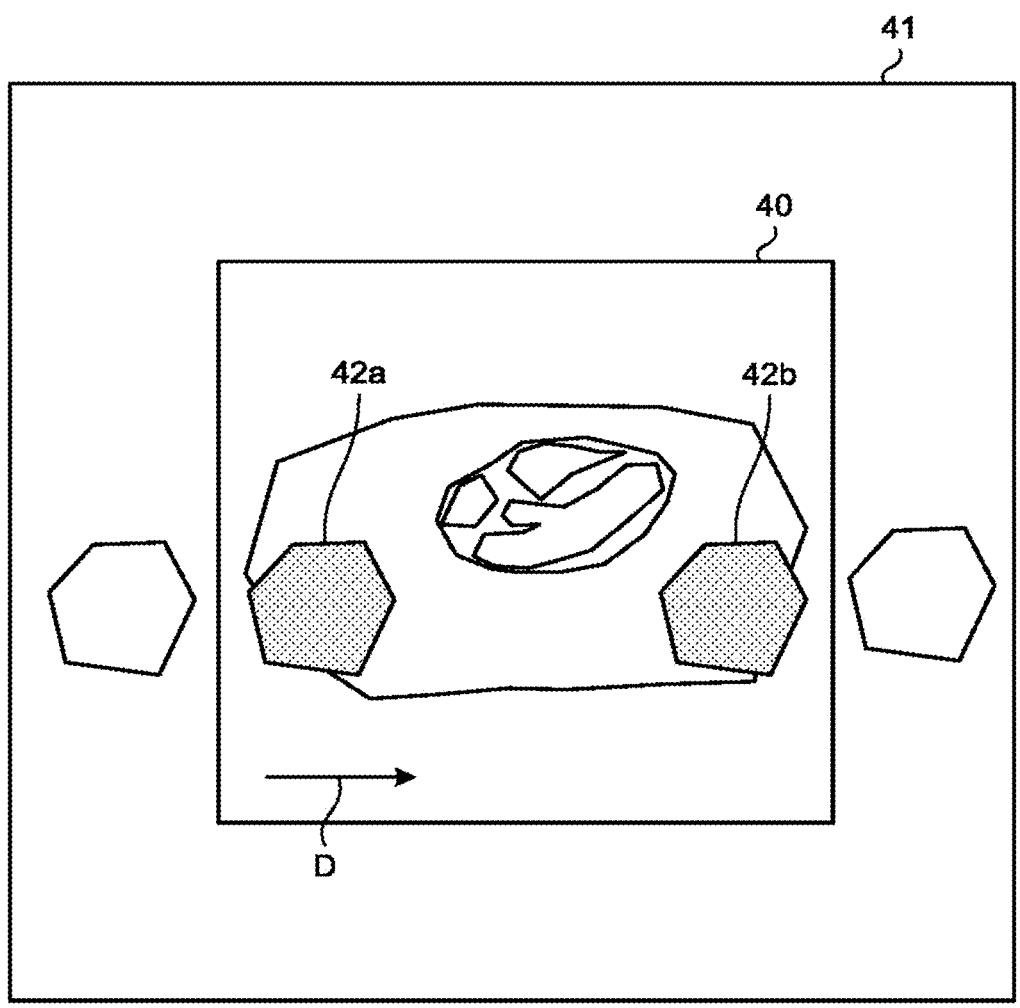
FIG. 6 is a diagram that illustrates the process that is performed by the magnetic resonance imaging apparatus according to the embodiment.

FIG. 6 illustrates an example of the above case. The cross-section image region 41 represents the region of the MPR image that corresponds to the set cross-section position. Conversely, the imaging range 40 represents the set imaging range. Folded regions 42a, 42b represent folding artifacts from outside the imaging range 40. Furthermore, the arrow D indicates the set phase encode direction.

At Step S160, the processing circuitry 150 uses the estimation function 150c to estimate the information about the folded regions 42a, 42b from outside the imaging range, which is the information about the image quality in the case of imaging (the second imaging) being conducted, on the basis of the cross-section image generated at Step S140, and the imaging range 40 (the imaging range 40 in which the second imaging is performed) of imaging due to magnetic resonance imaging. Then, the processing circuitry 150 uses the control function 150a to superimpose the information about the image quality, estimated by the estimation function 150c at Step S160, on the image data or the cross-section image and present it on the display 135.

Furthermore, the processing circuitry 150 indicates the set phase encode direction D by using an arrow and estimates folding artifacts from outside the assumed imaging range. The processing circuitry 150 uses the control function 150a to, for example, highlight the estimated folding artifact on the display 135.

As the above operation is performed, users may predict the presence or absence of folding artifacts more easily and in an intuitive way. As a result, users may adjust an imaging condition in such a manner that no folding artifacts occur. For example, users may adjust the imaging condition by enlarging the imaging range 40, changing the phase encode direction D, applying saturation pulses, or the like. Users may adjust the imaging condition in an intuitive way with less movement of the eyes. This aspect is advantageous in the case of imaging for sites, such as elbows or knees, for which it is difficult for the subject P to be fixed at the regular body position on the bed 4.

In FIG. 6, an explanation is given of a case where the MPR image is a cross-section image on which the information about the image quality, estimated by the estimation function 150c at Step S160, is superimposed; however, embodiments are not limited to this situation. For example, the cross-section image on which the estimated information about the image quality is superimposed may be an image that is collected during multi-slice imaging and that corresponds to one slice. Furthermore, the cross-section image on which the estimated information about the image quality is superimposed may be, for example, projection image data that is obtained by conducting projection on three-dimensional volume data using the Maximum Intensity Projection (MIP) method. Furthermore, in FIG. 6, an explanation is given of a case where the information about the image quality estimated by an estimation function 150e at Step S160, is superimposed on the cross-section image; however, embodiments are not limited to this situation. For example, the estimated information about the image quality may be superimposed not on cross-section images for MPR, or the like, but for example on the image data that is the original data before the cross-section is clipped.

Figure 7:
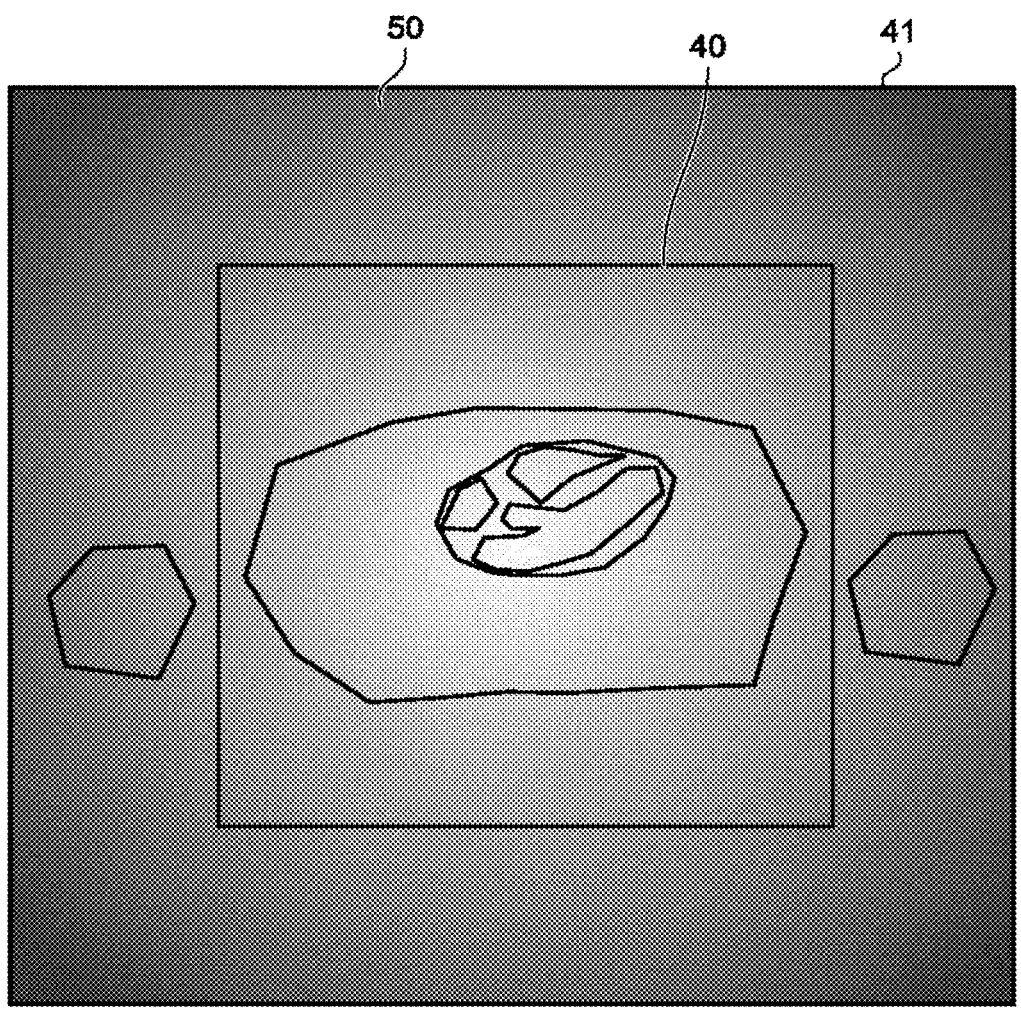
FIG. 7 is a diagram that illustrates the process that is performed by the magnetic resonance imaging apparatus according to the embodiment.

FIG. 7 illustrates an example of the process in a case different from FIG. 6. The cross-section image region 41 represents the region of the MPR image that corresponds to the set cross-section position. Conversely, the imaging range 40 represents the set imaging range. A folded region 42 represents a folding artifact from outside the imaging range 40. Furthermore, the arrow D indicates the set phase encode direction. Image quality information 50 is the information about the magnetic field intensity on the cross-section image region 41 (or the imaging range 40).

In the example of FIG. 7, at Step S160, the processing circuitry 150 uses the estimation function 150c to estimate the information about the magnetic field intensity in the imaging range on the basis of the cross-section image generated at Step S140, and the shimming adjustment value of the static magnetic field or the high-frequency magnetic field. In other words, the processing circuitry 140 estimates, for example, by the estimation function 150c, distribution information about non-uniformity of the static magnetic field, as information about an image quality in a case in which the second imaging is conducted. Then, the processing circuitry 150 uses the control function 150a to superimpose the information about the magnetic field intensity in the imaging range estimated by the estimation function 150c at Step S160, on the image data or the cross-section image and presents it on the display 135. In other words, the processing circuitry 150 presents on the display 135, by the control function 150a, distribution information about non-uniformity of the static magnetic field estimated at Step S160, superimposing the distribution information about non-uniformity of the static magnetic field estimated at Step S160 on the magnetic resonance image corresponding to the first imaging. For example, the processing circuitry 150 presents on the display 135, by the control function 150a, a contour map of the static magnetic field, superimposing the contour map of the static magnetic field on the magnetic resonance image corresponding to the first imaging, regarding a region including the region of interest for the second imaging. As another example, in a case in which values of the static magnetic field contain an outlier that is a value different from a normal value, the processing circuitry 150 presents on the display 135, by the control function 150a, information about the position of the outlier of the static magnetic field, superimposing the information about the position of the outlier of the static magnetic field on the magnetic resonance image corresponding to the first imaging.

Due to the above operation performed, if the information about the magnetic field intensity in the imaging range is for example the MPR image of the B0 or B1 map, the MPR image of the B0 or B1 map is presented on the cross-section image generated at Step S140 in a superimposed manner, whereby it may be easily determined whether the static magnetic field or the high-frequency magnetic field is sufficiently uniform at the region of interest.

Furthermore, according to another example, at Step S160, the processing circuitry 150 may use the estimation function 150c to estimate the information about the g-factor on the basis of the cross-section image, generated at Step S140, and the reduction factor for parallel imaging. Then, the processing circuitry 150 uses the control function 150a to superimpose the information about the g-factor estimated by the estimation function 150c at Step S160, on the image data or the cross-section image and presents it on the display 135.

In this way, the processing circuitry 150 uses the estimation function 150c to calculate the g-factor on the basis of the sensitivity map, the imaging range, and the reduction factor for parallel imaging, and it uses the control function 150a to superimpose it on the cross-section image, for example, and present it on the display 135. Thus, it is possible to easily determine whether the region of interest is a region where a folding artifact is likely to occur.

Furthermore, according to another example, at Step S160, the processing circuitry 150 may use the estimation function 150c to estimate the information about the distribution of sensitivity of the receiver coil on the basis of the cross-section image generated at Step S140, and the imaging range (the imaging range in a case in which the second imaging is conducted) for imaging due to magnetic resonance imaging.

In this case, then, the processing circuitry 150 uses the control function 150a to superimpose the information about the distribution of sensitivity of the receiver coil, estimated by the estimation function 150c at Step S160, on the cross-section image, for example, and presents it on the display 135. In this manner, it is possible to determine how much the coil sensitivity is at each position on the captured cross-section.

Furthermore, according to another example, at Step S160, the processing circuitry 150 may use the estimation function 150c to estimate the information on the distance from the center of the magnetic field on the basis of the cross-section image generated at Step S140, and the information on the imaging range of each element of the receiver coil 8. In this case, then, the processing circuitry 150 uses for example the control function 150a to superimpose the information, estimated by the estimation function 150c at Step S160, on for example the cross-section image and presents it on the display 135.

In this manner, for example, users may check how far apart the set cross-section position is from the center of the magnetic field.

Figure 8:
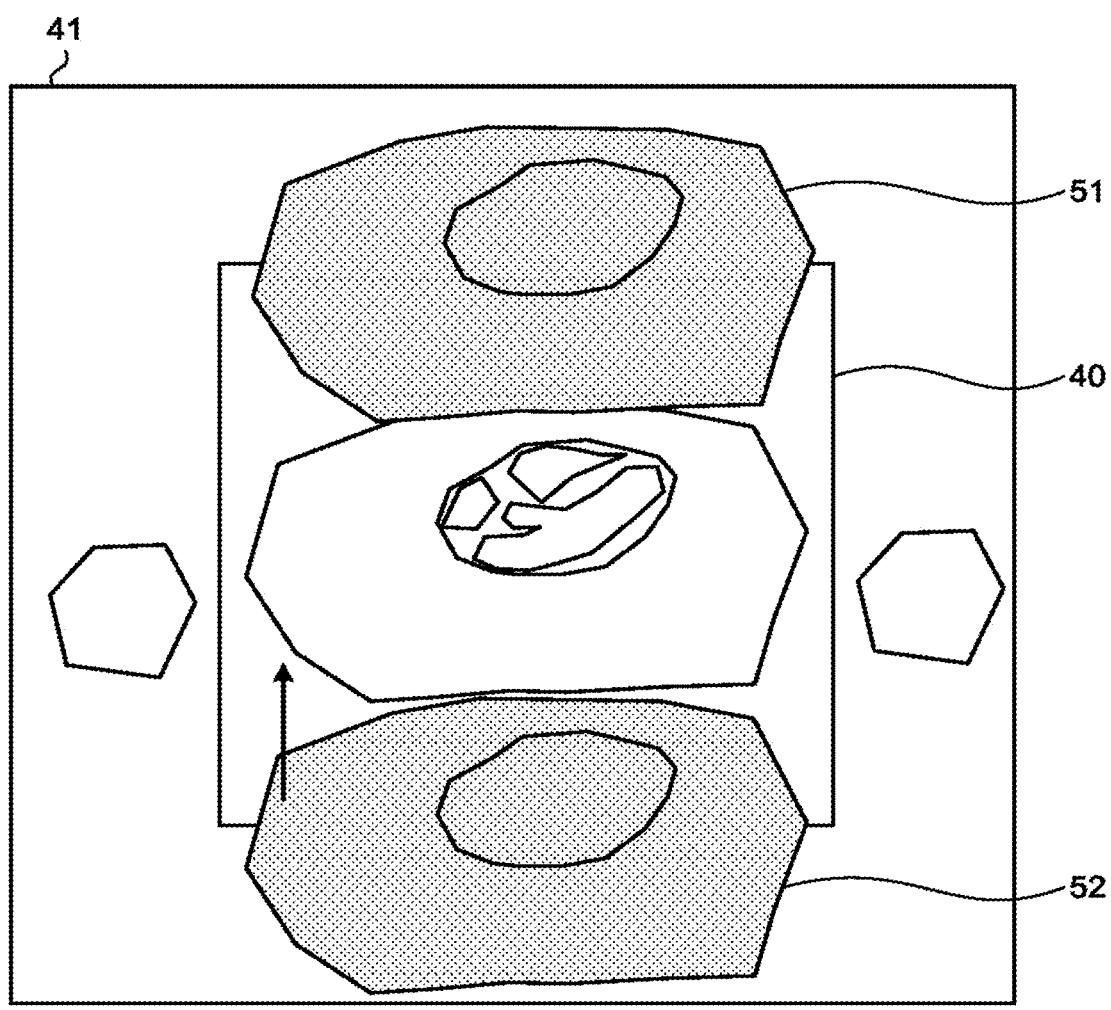
FIG. 8 is a diagram that illustrates the process that is performed by the magnetic resonance imaging apparatus according to the embodiment.

FIG. 8 illustrates an example of the process in a case different from FIG. 6 and FIG. 7. The cross-section image region 41 represents the region of the MPR image that corresponds to the set cross-section position. Conversely, the imaging range 40 represents the set imaging range. A folded region 51 and a folded region 52 represent regions where folding artifacts occurs.

In the example of FIG. 8, at Step S160, the processing circuitry 150 uses the estimation function 150c to estimate the information about the folded image prior to the unfolding on the basis of the cross-section image generated at Step S140, and the reduction factor for parallel imaging. Then, the processing circuitry 150 uses the control function 150a to superimpose the information, estimated by the estimation function 150c at Step S160, on for example the cross-section image and present it on the display 135.

As described above, the processing circuitry 150 uses the control function 150a to present, on the display 135, the folded image prior to the unfolding in parallel imaging, estimated from the imaging range and the reduction factor for parallel imaging. Thus, users may check whether the region of interest is in a position where folding artifacts easily occur.

Figure 9:
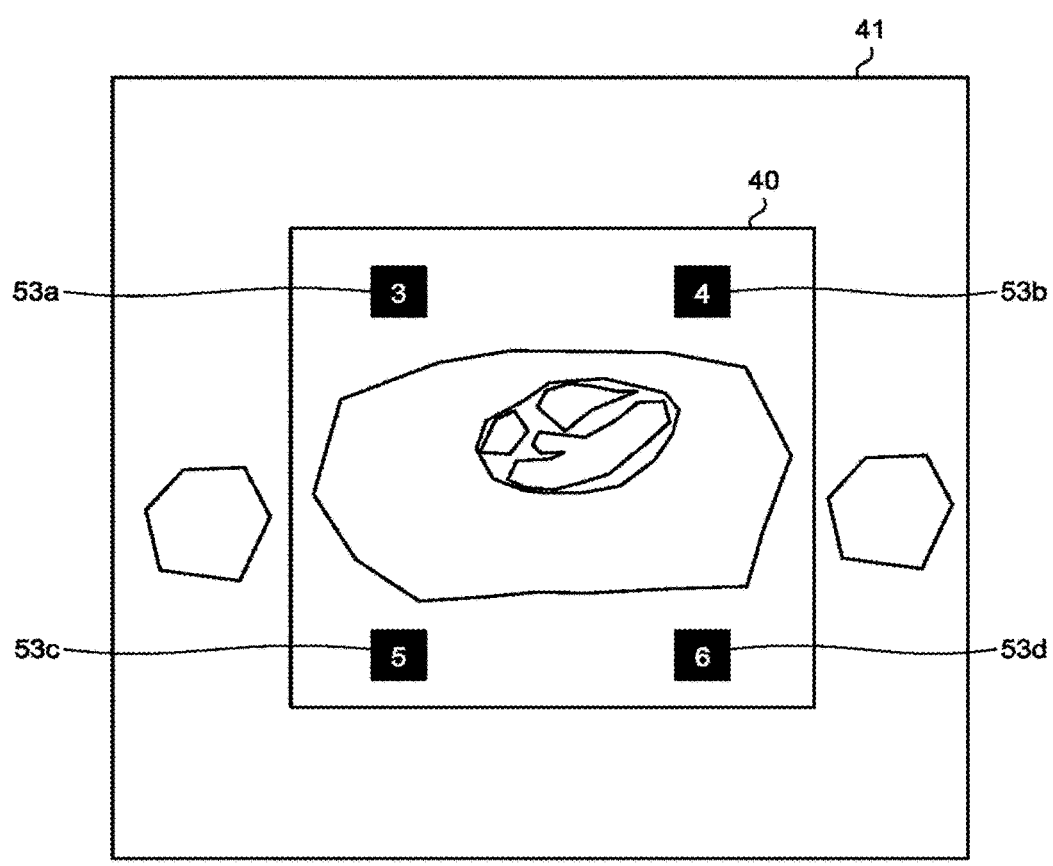
FIG. 9 is a diagram that illustrates the process that is performed by the magnetic resonance imaging apparatus according to the embodiment.

FIG. 9 illustrates an example of the process different from FIG. 6 to FIG. 8. The cross-section image region 41 represents the region of the image that corresponds to the set cross-section position. Conversely, the imaging range 40 represents the set imaging range. Number 53a, number 53b, number 53c, and number 53d denote the numbers of the coil elements, indicated on the MPR image (cross-section image). For example, the number 53a means that the number of the coil element located in the vicinity of the corresponding region, is "3". Furthermore, for example, the number 53b means that the number of the coil element located in the vicinity of the corresponding region is "4".

In the example of FIG. 9, at Step S160, the processing circuitry 150 uses the estimation function 150c to estimate the information about the position of the receiver coil that is used for imaging. Then, at Step S170, the processing circuitry 150 uses the control function 150a to superimpose the information estimated by the estimation function 150c at Step S160, on for example the cross-section image and present it on the display 135.

As described above, the processing circuitry 150 uses the control function 150a to display the number of the coil element of the receiver coil 8 on the MPR image (cross-section image). Thus, users may check the arrangement of the coil elements on the setting screen position. As a result, users easily determine whether the coil element is properly selected.

Furthermore, at Step S170, the processing circuitry 150 may use the control function 150a to superimpose, on the image data or the cross-section image, the information estimated by the estimation function 150c at Step S160 together with the information that uses a numerical value or a shape to represent the information that indicates whether the coil element is located at the back or the front with reference to the cross-section position, and present it on the display 135.

Furthermore, the processing circuitry 150 may receive input of changes in selection or non-selection of the coil element from the input interface 134 and, based on the received input, execute the estimation function 150c. In such a case, at Step S160, the processing circuitry 150 uses the estimation function 150c to estimate the information about the position of the receiver coil 8 used for imaging, on the basis of the cross-section image and the information that indicates whether each element of the receiver coil 8 is used. Then, at Step S170, the processing circuitry 150 uses the control function 150a to superimpose the information estimated by the estimation function 150c at Step S160, on the image data or the cross-section image and present it on the display 135.

Figure 10:
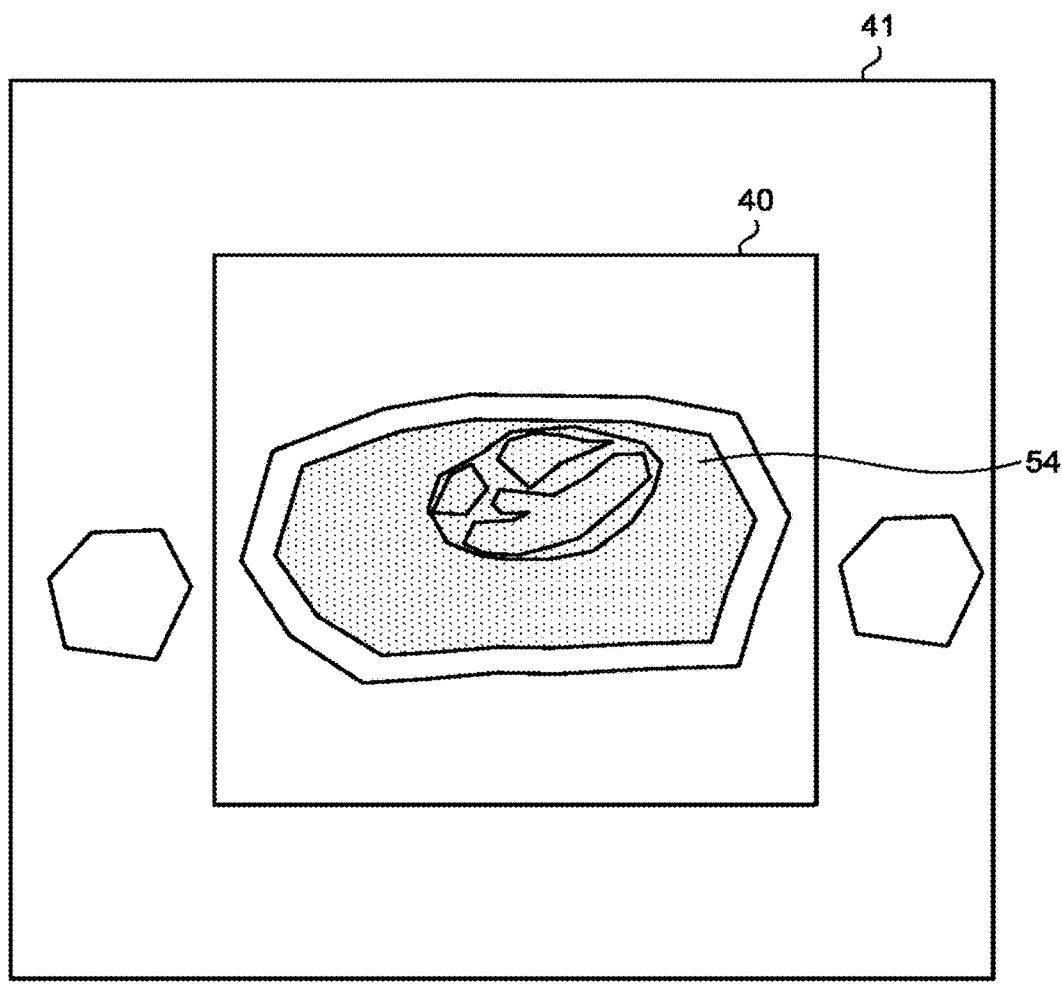
FIG. 10 is a diagram that illustrates the process that is performed by the magnetic resonance imaging apparatus according to the embodiment.

FIG. 10 illustrates an example of the process in a case different from FIG. 6 to FIG. 9. The cross-section image region 41 represents the region of the MPR image (cross-section image) that corresponds to the set cross-section position. Conversely, the imaging range 40 represents the set imaging range. A magnetic field distortion compensation image 54 represents a magnetic field distortion compensation image that is presented on the MPR image (cross-section image). Here, the magnetic field distortion compensation is compensation that is conducted through post-processing, such as image deformation, on the phenomenon of image distortion (for example, an object in a perfect circle being captured as an ellipse) in a case where the gradient magnetic field during encoding in the read-out direction, or the like, is not an ideal straight line due to design constraints, or the like.

In the example of FIG. 10, at Step S160, the processing circuitry 150 uses the estimation function 150c to estimate the magnetic field distortion compensation image on the basis of the cross-section image generated at Step S140, and the information on the imaging range of each element of the receiver coil. Then, at Step S170, the processing circuitry 150 uses the control function 150a to present the information, estimated by the estimation function 150c at Step S160, on the image data or the cross-section image in a superimposed manner on the display 135.

As described above, the processing circuitry 150 uses the control function 150a to present the imaging range and the image for which the magnetic field distortion compensation has been done, on the display 135. Especially, in a case where the subject P is set at a position far from the center of the magnetic field, such as shoulders, elbows, or hands, the amount of compensation for the magnetic field distortion compensation is large, and the position of the image after magnetic field distortion compensation is likely to be different from the one that is estimated by the user when the imaging position is set. In such a case, too, users may previously check changes in the image before and after magnetic field distortion compensation.

There are various possibilities with regard to the timing of Step S170, i.e., the timing in which the processing circuitry 150 uses the control function 150a to present the information about the image quality on the display 135, superimposing the information on the cross-section image.

According to an example of the possibilities, for example, the processing circuitry 150 uses a reception function (not illustrated) to receive, from users, an input to correct parameters with regard to the settings of imaging due to magnetic resonance imaging. While the reception function receives a correction input, the processing circuitry 150 uses the control function 150a to present, on the display 135, the information about the image quality, superimposing the information on the cross-section image. Conversely, while the reception function does not receive a correction input, the processing circuitry 150 uses the control function 150a to hide the information about the image quality.

Furthermore, according to another example of the possibilities, for example, the processing circuitry 150 uses a reception function (not illustrated) to receive, from users, an input to correct parameters with regard to the settings of imaging due to magnetic resonance imaging. After reception of the correction input is completed, the processing circuitry 150 uses the control function 150a to present, on the display 135, the information about the image quality, superimposing the information on the cross-section image. Furthermore, the processing circuitry 150 may use the control function 150a to automatically hide the information about the image quality if, for example, a predetermined button is pressed, or after a certain time has elapsed since a correction input is completed.

Furthermore, according to another example of the possibilities, for example, the processing circuitry 150 uses a determination function (not illustrated) to make a determination by comparing the value that indicates the information about the image quality to a predetermined threshold. On the basis of a determination result by the determination function, the processing circuitry 150 uses the control function 150a to present, on the display 135, the information about the image quality, superimposing the information on the cross-section image. For example, the processing circuitry 150 automatically displays the cross-section image and the image quality information if the estimated information about the image quality exceeds a predetermined threshold.

With reference back to the flowchart of FIG. 2, the processing circuitry 150 receives an input to correct a parameter via the input interface 134 from the user who has viewed the information about the image quality, superimposing the information on the cross-section image and presents on the display 135 at Step S170 (Step S180). In other words, the processing circuitry 150 receives, by the reception function and through the interface 134, a designation operation on the magnetic resonance image from an operator. If an input to correct a parameter is received (Yes at Step S180), the process returns to Step S130. In other words, the processing circuitry 150 changes a setting of an imaging condition related to the second imaging based on the designation operation. If a parameter is not corrected (No at Step S180), the process proceeds to Step S190. In other words, at Step S180, the processing circuitry 150 receives, by the reception function, designation of a region of interest for shimming from the operator. For example, the processing circuitry 150 receives, by the reception function, designation of a region that the operator focuses on in the imaging from the operator. In such a case, for example, when the operator focuses on the heart, the processing circuitry 150 designates the region of interest by selecting on the screen the region that is in the vicinity of the heart. As another example, the processing circuitry 150 receives, for example, by the reception function, from an operator, designation of the region that is not subjected to a shimming calculation processing. In other words, for example at Step S170, in a case in which a contour map of the static magnetic field is superimposed on the magnetic resonance image and is presented on the display 135, the operator reads an outlier value from the contour map presented on the display 135 and designates the region that is not subjected to a shimming calculation based on the result of the reading. Thus, it becomes possible to lessen the artifact of the image by setting the selected region to be excluded from the calculation processing.

Subsequently, the processing circuitry 150 calculates, by the control function 150a, a value for shimming based on the designation of the region of interest, and changes the setting of the imaging condition for the second imaging such that the calculated value is applied. For example, in the step described above, when the operator designates the region that is not subjected to a shimming calculation, as for the designated region, the processing circuitry 150 replaces, by the control function 150a, the value of the static magnetic field with a value interpolated from the neighboring region and changes the setting of the imaging condition for the second imaging based on the replaced value.

The processing circuitry 150 may automatically correct an imaging parameter on the basis of the MPR image generated at Step S140, and the image information, estimated at Step S160. For example, the processing circuitry 150 may adjust the information, such as the value of the current that flows through the static magnetic-field compensation coil or the intensity/waveform/phase of a multi-transmitter coil, on the basis of the value of the B0 distribution or the B1 distribution at the set cross-section position (shimming). Furthermore, for example, the processing circuitry 150 may calculate the center of gravity of the region of an image other than the air after magnetic field distortion and correct the imaging position such that the object moves to the center of the imaging range after magnetic field distortion. Furthermore, for example, the processing circuitry 150 may specify the region of interest on the cross-section image via the input interface 134 and, in order to further improve the image quality information within its range, correct the imaging range, the encode direction, shimming, or the imaging position such that folding of parallel imaging does not occur.

Finally, the sequence control circuitry 10 conducts second imaging that is imaging for diagnosis (imaging of the examination sequence) on the basis of the determined cross-section position or imaging parameter (Step S190). The second imaging is imaging that is subsequent to the first imaging. After Step S190 is finished, the process returns to Step S120.

Furthermore, with regard to the above-described image quality information, valid information is different depending on an examination site or an examination sequence. For example, for contrast dynamic examinations on a breast, the information on the B0, B1 map is useful because they have a high correlation with a fat suppression performance. Furthermore, as the setting body position of, for example, shoulders, elbows, or hands, is often changed based on the state of the subject P, the information on the folding that takes place outside the FOV, it is useful to utilize the sensitivity distribution image of the receiver coil, or the image before and after magnetic field distortion. Furthermore, for typical examinations using magnetic resonance imaging, the memory 132 stores the previously adjusted imaging parameter for each sequence that is grouped for each examination site or examination content. Then, the sequence control circuitry 10 selects the group of imaging sequences, stored in accordance with an examination content, sets the cross-section position or conducts fine adjustments on the imaging parameter in accordance with the situation of the patient, and starts an examination. Because of this background, the memory 132 may set the presence or absence of display of a cross-section image or image quality information or the type of image quality information to be displayed for each imaging sequence that is previously stored.

Furthermore, embodiments are not limited to this situation.

In the embodiment, an explanation is given of, for example, a case where locator images are three-dimensional data if the processing circuitry 150 generates locator images. However, for example, at Step S100, the sequence control circuitry 10 may use for instance 2D sequence to conduct multi-slice imaging. In such a case, at Step S110, the processing circuitry 150 generates locator images on the basis of multi-slice imaging that is conducted by the sequence control circuitry 10 at Step S100.

In an example of the case where the three-dimensional data is a sensitivity map at Step S110, for example, the processing circuitry 150 may generate the sensitivity map by using the ratio between the image of each element of the coil 8 and the sum of squares (SOS) of the entire element image at Step S110.

In an example of the case where the three-dimensional data is shimming images at Step S110, the processing circuitry 150 may calculate the B0 distribution from magnetic resonance spectroscopy (MRS) images at Step S110.

In an example of the case where the three-dimensional data is generated as shimming images at Step S110, the processing circuitry 150 may calculate the B1 distribution on the basis of deviations of multiple tagging images at Step S110.

Furthermore, for example, the three-dimensional data acquired at Step S110 may have multiple functions. For example, the three-dimensional data acquired at Step S110 may have both the function as the image data that represents the sensitivity map and the function as the locator image that indicates the form information. Furthermore, for example, the three-dimensional data acquired at Step S110 may have both the function as the image data that represents the shimming map and the function as the locator image that indicates the form information.

At Step S130, the processing circuitry 150 may specify for example three points on the cross-section as an example of the information that specifies the region of the cross-section in the examination sequence via the input interface 134.

As for the input interface for the cross-section position of the examination sequence at Step S130, if the reconstructed image of the examination sequence which has been already captured is not perpendicular to the set cross-section, the processing circuitry 150 may use the control function 150a to present the positional relationship between the reconstructed image and the set cross-section on the display 135 by setting the FOV as a parallelogram.

At Step S130, the processing circuitry 150 may present multiple reconstructed images on the display 135 and receive an input of the information about the set cross-section.

The data format of the three-dimensional data or the image quality information according to the embodiment is not limited to the above-described examples. For example, with regard to the B0/B1 map or the distance image from the center of the magnetic field, any threshold may be set as an alarm level standard to provide binary images, either OK (acceptable) regions or NG (out of the ordinary) regions. Furthermore, the data format may be such that it is structured by using numerical values to indicate whether NG (out of the ordinary) regions exist in the first place or how much volume NG (out of the ordinary) regions exist.

At Step 170, it is described that the reason why the processing circuitry 150 presents the estimation result on the display 135 superimposing the estimation result on the magnetic resonance image is the following: By information regarding the image quality such as a structural image or a function image being superimposed on the magnetic resonance image and being displayed, the relative positional relationship of the information regarding the image quality with respect to the position of the tumor becomes more intuitively understandable. However, embodiments are not limited to this situation. In other words, the processing circuitry 150 may present the estimation result alone on the display 135. In such a case, the magnetic resonance imaging apparatus 100 according to an embodiment includes sequence control circuitry 120 and processing circuitry 150. The sequence control circuitry 120 conducts, on a subject, first imaging and second imaging that is subsequent to the first imaging. The processing circuitry 150 estimates information about an image quality in a case in which the second imaging is conducted based on a magnetic resonance image related to the first imaging and an imaging condition that is set with regard to the second imaging. The processing circuitry 150 presents the estimation result on the display 135. The processing circuitry 150 receives a designation operation on the magnetic resonance image from the operator. The processing circuitry 150 changes the setting of the imaging condition related to the second imaging based on the designation operation.

Program

Commands that are described in the procedures and mentioned in the above-described embodiment may be executed based on software programs. A general-purpose computer system previously stores the program and reads the program so that it is possible to obtain the same advantage as that of the magnetic resonance imaging apparatus or the image processing apparatus according to the above-described embodiment. The commands that are described according to the above-described embodiment are recorded as programs executable by computers in magnetic disks (flexible disks, hard disks, or the like), optical disks (CD-ROM, CD-R, CD-RW, DVD-ROM, DVD±R, DVD±RW, or the like), semiconductor memories, or similar recording media. The storage format may be any format as long as the storage medium is readable by a computer or an installed system. The computer reads a program from the recording medium and, in accordance with the program, causes the CPU to execute the command that is described in the program so that the same operations as those of the magnetic resonance imaging apparatus or the image processing apparatus according to the above-described embodiment may be implemented. It is obvious that if the computer acquires or reads a program, it may be acquired or read via a network.

Furthermore, part of each process to implement the above-described embodiment may be executed by the operating system (OS) that operates in the computer in accordance with commands of programs that are installed from a storage medium to the computer or an installed system, database management software, middleware (MW) of a network, or the like.

Furthermore, the storage media include not only the media that are independent from the computer or the installed system but also the storage media that download and store or temporarily store the programs that are transmitted via a local area network (LAN), the Internet, or the like.

Furthermore, the storage medium is not limited to one, and the storage medium according to the embodiment includes a case where the process according to the above-described embodiment is executed from multiple media, and the structure of the medium may be any structure.

Furthermore, the computer or the installed system according to the embodiment executes each process according to the above-described embodiment on the basis of the programs that are stored in the storage medium, and it may have any structure, such as the single apparatus like a personal computer or a microcomputer, or a system in which multiple apparatuses are connected via a network.

Furthermore, the computer according to the embodiment includes not only a personal computer but also an arithmetic processing device, a microcomputer, or the like, included in the information processing apparatus, and it is the collective term for apparatuses and devices that are capable of executing functions according to the embodiment by using programs.

Hardware Configuration

Figure 11:
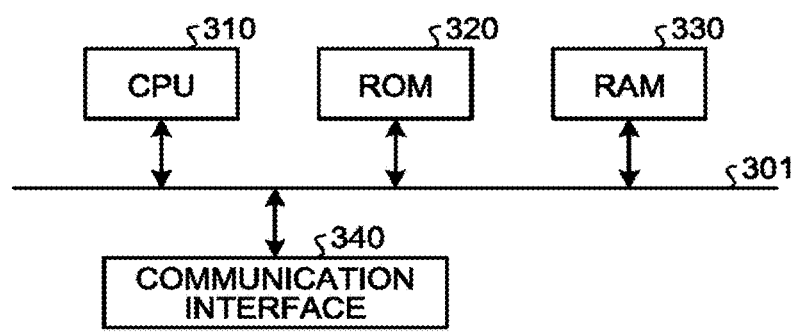
FIG. 11 is a diagram that illustrates the hardware configuration of an image processing apparatus according to the embodiment.

FIG. 11 is a diagram that illustrates the hardware configuration of the image processing apparatus 200 according to the embodiment. The image processing apparatus 200 according to the above-described embodiment includes a control device, such as a central processing unit (CPU) 310, a storage device, such as a read only memory (ROM) 320 or a random access memory (RAM) 330, a communication interface 340 that is connected to a network to perform communications, and a bus 301 that connects each unit. The programs executed by the image processing apparatus 200 according to the above-described embodiment are provided by being previously installed in for example the ROM 320. Furthermore, the programs executed by the image processing apparatus 200 according to the above-described embodiment may cause the computer to function as each unit of the above-described image processing apparatus 200. In the computer, the CPU 310 may load the programs from the storage medium readable by the computer into the primary storage device and execute it.

In the embodiments, the explanation was given as to the magnetic resonance imaging apparatus 100. However, embodiments are applicable to the image processing apparatus 200 as well. For example, an image processing apparatus 200 according to an embodiment includes processing circuitry 150. The processing circuitry 150 estimates, by the estimation function 150c, information about an image quality in a case in which second imaging that is subsequent to first imaging is conducted, based on a magnetic resonance image related to the first imaging and an imaging condition that is set with regard to the second imaging. The processing circuitry 150 presents, by the control function 150a, an estimation result on the display 135, superimposing the estimation result on the magnetic resonance image. The processing circuitry 150 receives a designation operation on the magnetic resonance image from an operator, and changes the setting of the imaging condition related to the second imaging based on the designation operation.

With the magnetic resonance imaging apparatus and the image processing apparatus according to at least one embodiment described above, the information about the image quality may be checked.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising:
sequence control circuitry configured to conduct, on a subject, first imaging, and second imaging that is subsequent to the first imaging; and
processing circuitry configured to
generate a first magnetic resonance image based on the first imaging conducted by the sequence control circuitry;
set an imaging condition with regard to the second imaging;
estimate, based on the first magnetic resonance image and the set imaging condition, information about an image quality in a case in which the second imaging is conducted,
cause a display to display the first magnetic resonance image and superimpose the estimated information on the displayed first magnetic resonance image,
receive, from an operator, a designation operation on the first magnetic resonance image,
change a setting of the imaging condition related to the second imaging based on the designation operation; and
generate a second magnetic resonance image based on the second imaging conducted by the sequence control circuitry.

2. The magnetic resonance imaging apparatus according to claim 1, wherein the processing circuitry is further configured to
estimate distribution information about non-uniformity of a static magnetic field as the estimated information about the image quality,
present, on the display, the estimated distribution information about non-uniformity of the static magnetic field, by superimposing the estimated distribution information on the displayed first magnetic resonance image,
receive, from the operator, designation of a region of interest for shimming,
calculate a value for shimming based on the designation of the region of interest, and
change the setting of the imaging condition for the second imaging such that the calculated value is applied.

3. The magnetic resonance imaging apparatus according to claim 1, wherein the processing circuitry is further configured to
generate, from image data, a cross-section image that includes a predetermined region of interest in a predetermined cross-section,
estimate the information based on the generated cross-section image and the imaging condition, and
present the information on the display, by superimposing the information on the image data or the cross-section image.

4. The magnetic resonance imaging apparatus according to claim 3, wherein the image data is any of a locator image that indicates information on a target to be imaged, an image that indicates sensitivity distribution of a receiver coil, and a shimming image that indicates magnetic field distribution of a static magnetic field or a high-frequency magnetic field.

5. The magnetic resonance imaging apparatus according to claim 3, wherein the processing circuitry is further configured to estimate, based on the cross-section image and an imaging range of the second imaging, information about folding from outside an imaging range.

6. The magnetic resonance imaging apparatus according to claim 3, wherein the processing circuitry is further configured to estimate information about a magnetic field intensity in an imaging range based on the cross-section image and a shimming adjustment value of a static magnetic field or a high-frequency magnetic field.

7. The magnetic resonance imaging apparatus according to claim 3, wherein the processing circuitry is further configured to estimate information about a folded image prior to unfolding based on the cross-section image and a reduction factor of parallel imaging.

8. The magnetic resonance imaging apparatus according to claim 3, wherein the processing circuitry is further configured to estimate information about g-factor based on the cross-section image and a reduction factor of parallel imaging.

9. The magnetic resonance imaging apparatus according to claim 3, wherein the processing circuitry is further configured to estimate information about a distribution of sensitivity of a receiver coil based on the cross-section image and an imaging range of the second imaging.

10. The magnetic resonance imaging apparatus according to claim 3, wherein the processing circuitry is further configured to estimate information about a position of a receiver coil that is used for the second imaging, based on the cross-section image and information as to whether each of a plurality of elements of the receiver coil is used.

11. The magnetic resonance imaging apparatus according to claim 3, wherein the processing circuitry is further configured to estimate an image after magnetic-field distortion compensation based on the cross-section image and information on an imaging range of each of a plurality of elements of a receiver coil.

12. The magnetic resonance imaging apparatus according to claim 3, wherein the processing circuitry is further configured to estimate information about a distance from a center of a magnetic field based on the cross-section image and information on an imaging range of each element of a receiver coil.

13. The magnetic resonance imaging apparatus according to claim 3, wherein the processing circuitry is further configured to
receive a correction input for the information from a user,
while the correction input is received, present the information on the display, by superimposing the information on the cross-section image,
and hide the information while the correction input is not received.

14. The magnetic resonance imaging apparatus according to claim 3, wherein after a correction input for the information is received from a user and reception of the correction input is completed, the processing circuitry is further configured to present the information on the display, by superimposing the information on the cross-section image.

15. The magnetic resonance imaging apparatus according to claim 3, wherein the processing circuitry is further configured to
make a determination by comparing a value that indicates the information to a predetermined threshold, and
present on the display, based on a result of the determination, the information, by superimposing the information on the cross-section image.

* * * * *